United States Patent [19]

Ceraso

[11] Patent Number: 5,755,916
[45] Date of Patent: May 26, 1998

[54] PROCESS FOR MAKING PLASTIC LAMINATES WITH METAL LAMINAE FOR PRINTED CIRCUITS ESPECIALLY, WITH ENDOTHERMIC HEATING

[75] Inventor: Bruno Ceraso, Milan, Italy

[73] Assignee: Cedal s.r.l., Milan, Italy

[21] Appl. No.: 500,984

[22] PCT Filed: Mar. 29, 1993

[86] PCT No.: PCT/IT93/00027

§ 371 Date: Jul. 24, 1995

§ 102(e) Date: Jul. 24, 1995

[87] PCT Pub. No.: WO94/17975

PCT Pub. Date: Aug. 18, 1994

[30] Foreign Application Priority Data

Feb. 10, 1993 [IT] Italy .................... MI93A0223

[51] Int. Cl.⁶ ..................... B30B 7/02; B32B 31/20
[52] U.S. Cl. ............... 156/288; 156/275.5; 156/563; 156/583.1
[58] Field of Search ............... 156/222, 275.5, 156/288, 323, 557, 563, 583.1

[56] References Cited

U.S. PATENT DOCUMENTS

| | | | |
|---|---|---|---|
| 1,945,560 | 2/1934 | Meyercord | 156/288 |
| 4,158,713 | 6/1979 | Degens | 156/288 |
| 4,666,551 | 5/1987 | Soberay | 156/288 |
| 4,854,994 | 8/1989 | Breiter | 156/563 |
| 5,160,567 | 11/1992 | Konicek | 156/563 |

FOREIGN PATENT DOCUMENTS 1321305  6/1973  United Kingdom ............... 156/288

Primary Examiner—Daniel Stemmer
Attorney, Agent, or Firm—Michael J. Striker

[57] ABSTRACT

Process for the production of plastic laminates for printed circuits with the components assembled in packages (11–13) arranged in piles (10) in a cold press (100) heating being done endothermically and obtained by electric heating elements connected in series to a generator (29) of electricity, copper laminae (20–25) being placed at the beginning and end of each package (11–13), or else sheets (30–33) of steel or other material being placed between one package and another and at the beginning and end of the pile (10).

3 Claims, 2 Drawing Sheets

PROCESS FOR MAKING PLASTIC LAMINATES WITH METAL LAMINAE FOR PRINTED CIRCUITS ESPECIALLY, WITH ENDOTHERMIC HEATING

BACKGROUND OF THE INVENTION

The invention concerns processes for production of plastic laminates with metal laminae.

Plastic laminates as a rule consist of sheets formed of several layers of plastic materials associated together in a stable manner, generally by pressing, on some kind of base such as paper, fabrics fibreglass or some other material.

The plastic materials may be of phenol, melamine, epoxy, polyester, silicon, fluoride, or others.

When producing printed circuits a metal lamina, usually of copper, is made to adhere to one or both sides during the pressing process A pile of similar packages is formed; each comprises a number of sheets, impregnated with plastic materials, and two copper laminae, externally, one on each side of the package. A metal sheet, such as stainless steel, is put between each package and the pile so formed goes inside a multi-plate press providing heat and pressure simultaneously.

When each thermic cycle, which includes a cooling stage, has been concluded, a compact and rigid product is obtained the single components of which are closely associated. Presses suited to this kind of production are complex and give a low output; this is due to their having several plates, to the need to provide heat and pressure at the same time in well-defined and accurate sequences, to the need for creating, by conduction, uniform temperatures throughout the various packages in the pile; of these packages clearly only those at the top and bottom will be in contact with the heating plates.

In addition to complicating the structure of the press, the presence of many heating plates makes loading and unloading the packages a slow operation, while problems are created for short production runs due to the difficulty of amortizing costs.

In particular the propagation of calories from heating plates to piled up packages is greatly hindered by heat having to penetrate some distance to reach the innermost packages.

This leads to high costs, both of the system and of running it, to wasted material, to long processing times and, consequently, to an expensive product.

SUMMARY OF THE INVENTION

Accordingly, it is an object of the present invention to provide a process for making plastic laminates, which avoids the disadvantages of the prior art.

When the process is performed in accordance with the present invention, it greatly reduces the above drawbacks at the same time offering considerable advantages as will be explained below.

Subject of the invention is a process for making plastic laminates, especially for printed circuits, by forming piles of packages each one comprising a highly insulated plate of prepreg or something similar and metal laminae, especially copper, on one or both sides of said plate.

Sheets of stainless steel or some other material are placed between one package and another.

The pile so composed is put into a press where heat and pressure combine to form the laminate.

According to the invention heat is generated endothermically inside the pile of packages by means of electric resistances connected in series to a suitably powered generator of electric current.

Pressure on the pile of packages is brought about by placing said pile inside a cold press or in an autoclave. The electric resistances are laminae of copper or another metal, present at the beginning and end of each package.

One lamina is connected to another on one side and on the other side, alternatingly, of the pile of packages. The laminae at the beginning and end of a pile are connected to leads from the generator of electric current. In one version the electric resistances are sheets of steel or some other metal placed between one package and another at the beginning and end of a pile.

One sheet is connected to another on one side, and on the opposite one alternatively of the pile.

The sheets of metal at the beginning and end of the pile are connected to leads from the generator of electric current.

In another version the sheets of stainless steel or another metal are laid in pairs between the packages.

The electric resistances are electric wiring bent to form a "U" their ends being fitted in between one pair of metal sheets and the following one, alternatively on one side and the opposite side of the pile of packages.

The ends of the two next lengths are superimposed inside the pair of metal sheets.

The ends of the lengths at the beginning and end of the pile lie on the external surfaces of the sheets, respectively at the beginning and end of the pile, and are connected to the leads from the generator of electricity. Therefore the effect of closing the press, at the start of the productive sequence, is to create pressure on the piles of packages and this causes complete contact among all the ends of the lengths of wire matching up inside the pairs of metal sheets ensuring closure of the electric circuit between all these lengths and the generator of electric current.

Each pile of packages can be placed beforehand inside a die comprising upper and lower plates connected by guiding and supporting pins, it being thus possible to apply the pressure, necessary for the process, on said die by placing it inside a cold press or in an autoclave. The invention clearly offers a number of advantages. Since the presses need not provide heat and pressure at the same time, they can be of a simpler kind and various models may be used, according to the type of laminate desired, as long as they can generate enough pressure. Heating is generated inside each single package and an even temperature can quickly be reached on all components. Runs of products can be of the required length.

Heating is made much faster compared with that possible in present presses where heat has to cover considerable distances before reaching right inside the pile of packages.

If mixed heating is used, associating the traditional kind produced by heating plates at the ends of the piles of packages with this endothermic kind, heating times are obviously much shorter so that productivity is higher. Working sequences are not only quicker but also simpler, so reducing waste and appreciably lowering costs.

Characteristics and purposes of the invention will become still clearer from the examples of its execution here following illustrated by diagrammatic figures.

DESCRIPTION OF PREFERRED EMBODIMENTS

Figure 1:
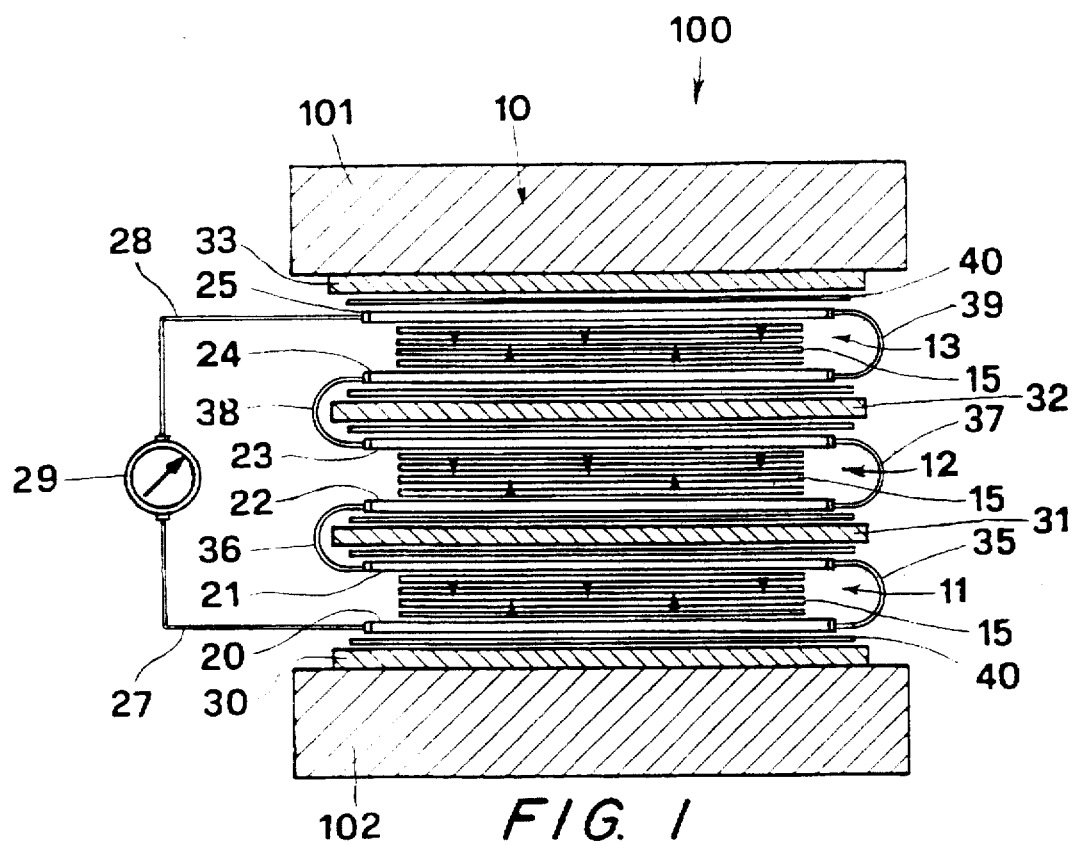
FIG. 1 Pile of packages, electrically connected in series, of copper laminae shown at the beginning and end of each package.

The pile 10, placed between the plates 101, 102 of the press 100, is composed of packages 11-13 each one comprising layers 15 of fibreglass impregnated with epoxy resins and copper laminae 20-25 at the ends.

Between one package and another there are steel sheets 30-33 with layers 40 for electrical insulation between. The various laminae are electrically connected in series by wiring 35-39.

The first lamina at the bottom 20 in particular is connected on the right side of the pile 10, by the external wire 35, with the second lamina 21 of the package 11. This latter is connected to the first lamina 22 of the second package 12 by the electric wire 36 on the left side of the pile 10. Said lamina 22 is connected on the right side of the pile by the electric wire 37 with the lamina 23 of said package 12, and so on up to the last lamina 25. The first lamina 20 and the last 25 of the pile 10 are respectively connected by the electric leads 27, 28, to the generator of electric current 29.

On starting up the press 100 and simultaneously closing the electric circuit, all the laminae 20-25 will act as electric heating elements and will directly heat the packages with their impregnated layers, as indicated by the arrows.

The whole pile of packages is therefore heated endothermically, namely from inside.

By simultaneous application of pressure the pressing process is therefore carried out.

Figure 2:
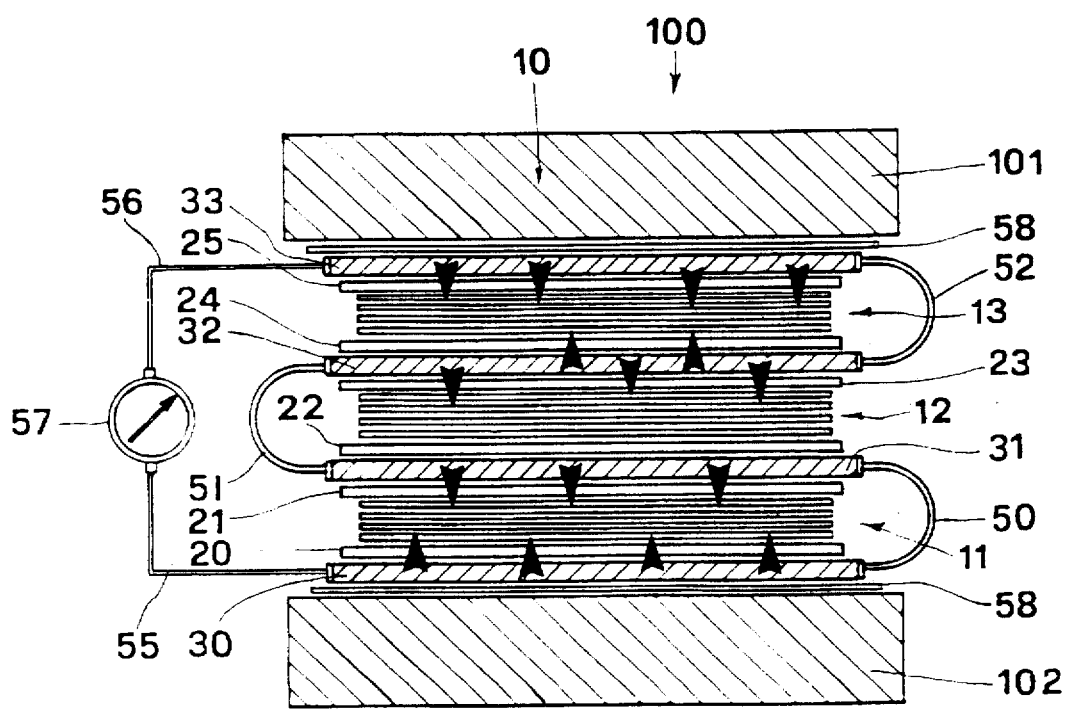
FIG. 2 Pile of packages, electrically connected in series, with steel sheets laid between the packages and at the ends of the pile.

FIG. 2 illustrates another version.

In the pile 10 electric connection in series is made between the steel sheets 30-33.

In particular the first sheet at the base 30 is connected to the next sheet 31 by wiring 50 on the right hand side of the pile 10. Said sheet 31 is connected to the following one 32 by wiring 51 on the left hand side of the pile 10, and so on up to the last sheet 33. The first sheet 30 and the last one 33 are respectively connected by wiring 55, 56 to the generator 57 of electric current.

Figure 3:
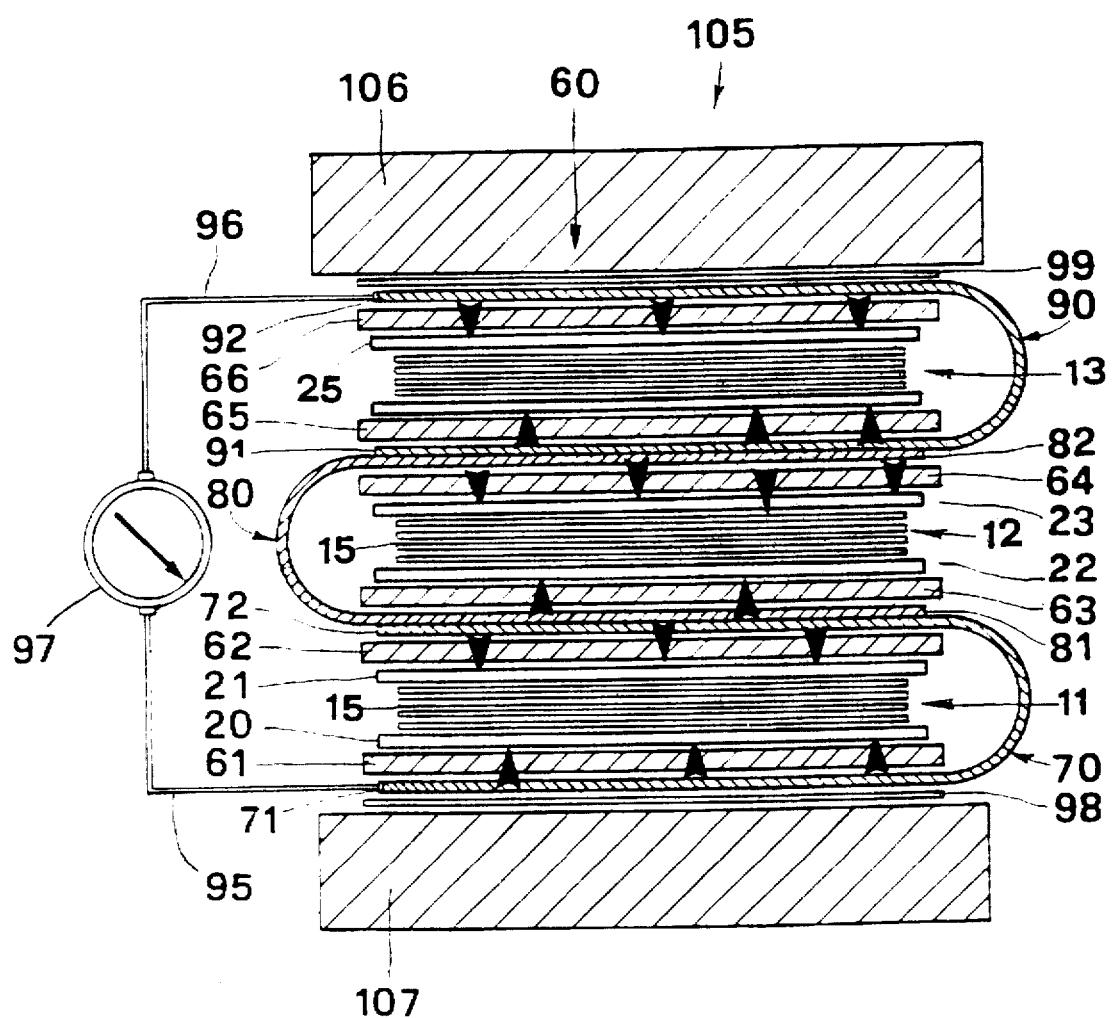
FIG. 3 Pile of packages, electrically connected in series, with lengths of electric wire between pairs of steel sheets placed between the packages.

By closing the electric circuit packages 11-13 are endothermically heated by electricity like the example in FIG. 1. FIG. 3 illustrates another version still. The pile 60 of packages 11-13 with copper laminae 20-25, comprises between one package and another, the pair of metal sheets 62-63 and 64-65 and the beginning and ending sheets of the pile, respectively 61 and 66.

Under the metal sheet 61, the end 71 of a length of copper 70, bent in a "U", is inserted from the right hand side of the pile 60.

The other end 72 is inserted between the higher pair of metal sheets 62, 63.

The lower end 81 of another length of wire 80 is similarly inserted, from the left hand side of the pile, between the pair of metal sheets 62,63 so as to match up with the end 72 of the first length 70.

The second end 82 is inserted between the next pair of metal sheets 64, 65, and so on.

The second end 92 of a length 90 of electric wire lies on top of the final metal sheet 66.

Insulating layers 98, 99 are placed between the plates 106 107 of the press 105 and the pile 60.

The lower 71 and upper 92 ends of copper wires 70,80,90 are joined by electric wires 95,96 to the generator 97 of electric current.

On starting up the press 105, matching between the matched up lengths inside the pairs of metal sheets 62,63 and 64,65 is complete which therefore makes complete electrical connection between the generator 97 and all the lengths of wire 70, 80, 90.

It follows that, when the electric circuit is closed, the lengths of wire 70, 80, 90 act as electrical heating elements.

I claim:

1. A process for production of plastic laminates, comprising the steps of: making a plurality of packages each including a highly insulating plate and metal laminae arranged at least on one surface of the plate; forming a pile of the packages with sheets of metal arranged between the packages; arranging the sheets of metal at a top and at a bottom of each package, with each sheet of metal being connected to the next sheet of metal in the pile, the first connection being on a first side of the pile, the second connection being on a second opposite side of the pile, and any remaining connections alternating on the first and second side of the pile until the last metal sheet in the pile is connected; connecting the sheets of metal at a top and at a bottom of the pile to leads from a generator of electric current as the electric current source so that the sheets of metal themselves operate as electric resistance and form electrical heating means for heating the pile of packages; inserting the pile of packages into a device for pressing; and heating the pile of packages by supplying electric current from the generator.

2. A process for production of plastic laminates, comprising the steps of: making a plurality of packages each including a highly insulating plate and metal laminae forming a pile of the packages with sheets of metal arranged between the packages; inserting the pile of the packages into a device for pressing; and heating the pile of packages by electrically connecting an electric current source in series with components of the pile to supply electric current to the component of the pile so that the components of the pile themselves operate as electric resistance and form electrical heating means; further comprising arranging the metal laminae at a top and at a bottom of each highly insulating plate, with each laminae being connected to the next laminae in the pile, the first connection being on a first side of the pile, the second connection being on a second opposite side of the pile, and any remaining connections alternating on the first and second side of the pile until the last laminae in the pile is connected; and connecting the metal laminae at a top and at a bottom of the pile to leads of a generator of electric current as the electric current source.

3. A process for production of plastic laminates, comprising the steps of: making a plurality of packages each including a highly insulating plate and metal laminae arranged at least on one surface of the plate; forming a pile of the packages with a pair of metal sheets arranged between each of the packages and a metal sheet placed at a top and a bottom of the pile; arranging electric wires which are bent to form a U and have two legs, with a first leg inserted between one pair of the sheets of metal and a second leg inserted between a next pair of the sheets of metal, each successive wire being arranged alternately on a first side and on a second opposite side of the pile, so that the legs of two successive wires are superimposed inside each pair of the sheets of metal, and arranging legs of an initial wire and a final wire to lay on external surfaces of the sheets of metal placed at the top and bottom of the pile, the initial and final wire being connected to leads from a generator of electric current which forms the electric current source, so that the electric wires themselves operate as electric resistance and form electrical heating means for heating the pile of packages, so that when a press is closed for pressing, the pressure brought to bear on the pile creates full contact among all legs of the wires matching up inside the pair of sheets of metal to provide closure of the electric circuit among the wires and the generators; inserting the pile of the packages into a device for pressing; and heating the pile of packages by supplying electric current from the generator.

* * * * *